United States Patent
Posseme et al.

(10) Patent No.: US 11,081,399 B2
(45) Date of Patent: Aug. 3, 2021

(54) METHOD OF PRODUCING MICROELECTRONIC COMPONENTS

(71) Applicant: COMMISSARIAT A L'ENERGIE ATOMIQUE ET AUX ENERGIES ALTERNATIVES, Paris (FR)

(72) Inventors: Nicolas Posseme, Grenoble (FR); Cyrille Le Royer, Grenoble (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 16/712,158

(22) Filed: Dec. 12, 2019

(65) Prior Publication Data

US 2020/0211906 A1    Jul. 2, 2020

(30) Foreign Application Priority Data

Dec. 13, 2018   (FR) ...................... 18 72889

(51) Int. Cl.
| | |
|---|---|
| H01L 21/8238 | (2006.01) |
| H01L 29/78 | (2006.01) |
| H01L 27/092 | (2006.01) |
| H01L 29/06 | (2006.01) |

(52) U.S. Cl.
CPC ........ *H01L 21/823807* (2013.01); *H01L 21/823878* (2013.01); *H01L 27/092* (2013.01); *H01L 29/0653* (2013.01); *H01L 29/7842* (2013.01)

(58) Field of Classification Search
None
See application file for complete search history.

(56) References Cited

U.S. PATENT DOCUMENTS

| | | |
|---|---|---|
| 6,635,938 B1 | 10/2003 | Nakahata et al. |
| 9,780,209 B1 | 10/2017 | Chen et al. |
| 2002/0182795 A1 | 12/2002 | Bae et al. |
| 2004/0079976 A1 | 4/2004 | Bae et al. |
| 2005/0253192 A1* | 11/2005 | Ban .................. H01L 29/7833 257/336 |
| 2016/0079420 A1* | 3/2016 | Liu .................. H01L 21/265 257/369 |

OTHER PUBLICATIONS

French Preliminary Search Report dated Sep. 30, 2019 in French Application 18 72889 filed on Dec. 13, 2018 (with English Translation of Categories of Cited Documents), 3 pages.

* cited by examiner

*Primary Examiner* — Asok K Sarkar
(74) *Attorney, Agent, or Firm* — Oblon, McClelland, Maier & Neustadt, L.L.P.

(57) ABSTRACT

A method is provided for producing a microelectronic component on a substrate including in an exposed manner on a first face thereof, an active zone and an electrical isolation zone adjacent thereto, the method including forming a gate on the active zone, forming spacers each configured to cover a surface of a different edge of the gate, and forming source and drain zones by doping portions of the active zone adjacent to the gate, the method successively including forming a first layer of spacer material above the active zone and the electrical isolation zone; an ion implantation to produce doping of the portions through the first layer; removing a modified portion of the first layer disposed overlooking the portions, the modified portion coming from the ion implantation, the removing being configured to preserve at least part of the first layer at a level of edges of the gate.

18 Claims, 6 Drawing Sheets

METHOD OF PRODUCING MICROELECTRONIC COMPONENTS

TECHNICAL FIELD

The present invention generally relates to the field of producing microelectronic components. Components obeying MOS (Metal Oxide Semiconductor) technology, generally produced in quantity on a substrate, with two complementary doping types (P and N) so as to form CMOS (Complementary Metal Oxide Semiconductor) circuits, are particularly aimed for. An application of the invention relates to the production of transistors, in particular based on a bulk substrate. It can relate to Flash memories, of which the basic cells are transistors.

STATE OF THE ART

In the field considered above, technologies for producing transistors based on bulk-type substrates are known. These substrates mainly comprise a base made of a semiconductor material, typically made of silicon, and electrically isolating zones, typically made of silicon dioxide. The electrically isolating zones are exposed at the level of one of the faces of the substrate and delimit the exposed zones made of the semiconductor material. Thus, the electrically isolating zones have an electrical separation function between different semiconductor material zones, also called active zones. These active zones are the place of producing transistors. It is, in particular, known to produce electrical isolation zones by producing isolated lateral trenches called STI (shallow trench isolation).

Figure 1:
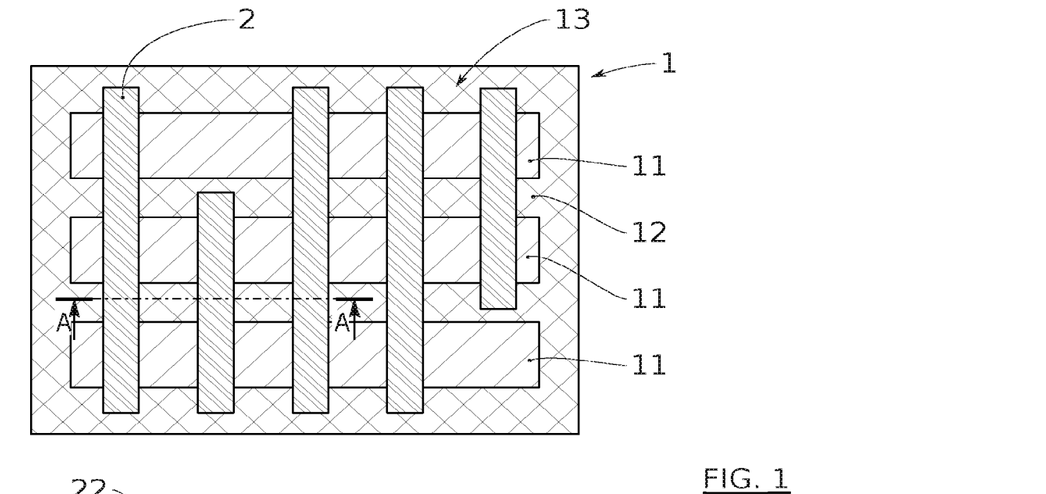
FIG. 1 schematises, as a top view, a substrate for producing microelectronic components.

In this context, FIG. 1 presents, as a top view, a diagram of a substrate 1 equipped, on a first face 13, with exposed zones comprising active zones 11 and electrical isolation zones 12. Transistor gates 21 can be formed on the base of bars of portions of gates 2 directed transversally, and more specifically perpendicularly, to the longitudinal orientation of the active zones 11.

Moreover, it is known that the production of CMOS components can require the addition of layers making it possible to apply the constraint (compressed or respectively tensioned) making it possible to increase the performance of the devices, in particular field-effect transistors (of P or respectively N type). These constrained layers are also called "stress liners". The effectiveness thereof depends on the thickness of the layer, often produced with a silicon nitride base, but the deposition thereof causes filling defects which is conveyed by the short-circuiting of microelectronic components in the vicinity.

Figure 2:
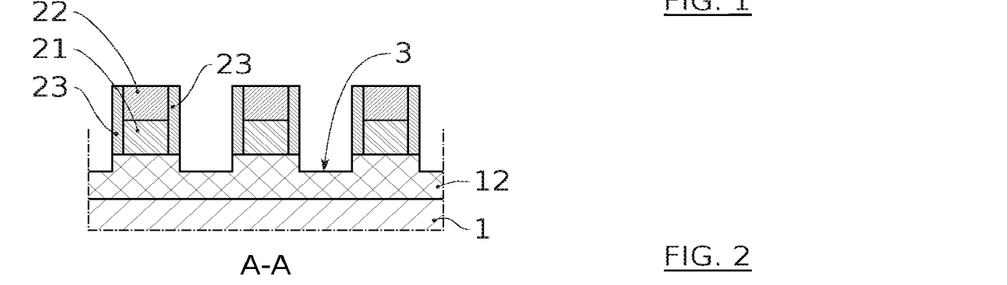
FIG. 2 presents a phase for producing transistors according to the state of the art.

FIGS. 2 to 7B explain these defects. They represent cross-sectional views at the level of the line A-A of FIG. 1, so as to show the impact of the production steps on the electrical isolation zones. They present, in a summarised manner, successive phases of producing components. In FIG. 2, on the base of the substrate 1, gates 21 are produced (generally made of polysilicon with an underlying electrically isolating layer, typically of oxide, not represented in the figures). Moreover, at this stage, spacers 23 have been formed by a deposition of a spacer layer, typically made of silicon nitride, and an etching, with well-known photolithographic and etching techniques. A hard mask 22 overlooks the gate 21 of the transistors during this step, which also comprises the production of source/drain zones on portions of the active zone, where the transistor is present, adjacently to the gate. This production involves successive doping, of N type and of P type to form two types of transistors of CMOS technologies. During these steps, the electrical isolation zone 12 is affected such that a consumed zone 3 appears on the surface thereof, in the form of hollow reliefs.

Figure 3:
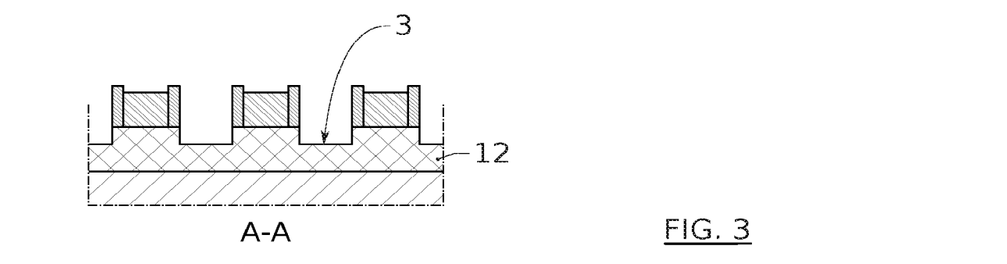
FIG. 3 shows a mask removal step, subsequent to that of FIG. 2.

Likewise, the step of removing the hard mask 22 presented in FIG. 3 heightens the consumption of isolating materials at the level of the zone 3.

Figure 4:
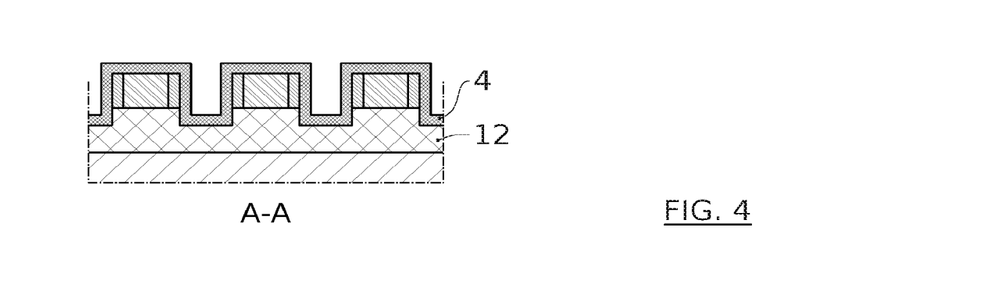
FIG. 4 shows a step of depositing a protection, subsequent to that of FIG. 3.
Figure 5:
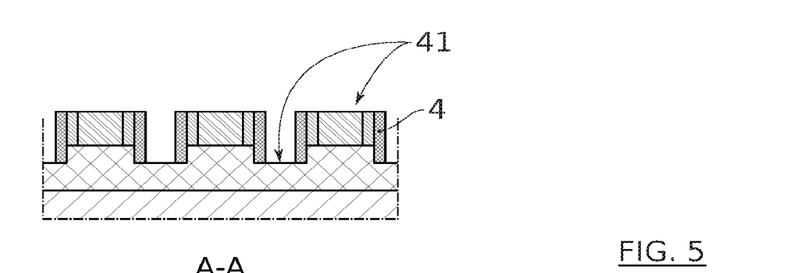
FIG. 5 shows an etching step, subsequent to that of FIG. 4.
Figure 6:
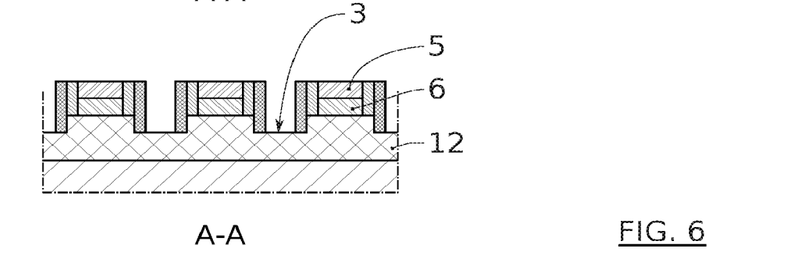
FIG. 6 shows a silicifying step, subsequent to that of FIG. 5.

A following step can be the deposition of a protective coating of the gates, in the form of a layer 4, for example of silicon nitride, such as in FIG. 4. This protection must then be removed selectively on the horizontal portions to clear the top of the gate and the surface of the isolation zones, as FIG. 5 shows with openings 41 in the protective layer 4, inducing an additional consumption of the isolation material at this level. Following steps are presented in FIG. 6 with a silicifying of a portion 5 of the top of the gate.

It must be noted that these steps generally include one or more thermal treatments, as well as cleaning phases which can also be damaging to the integrity of the material of the isolation zones.

Figure 7A:
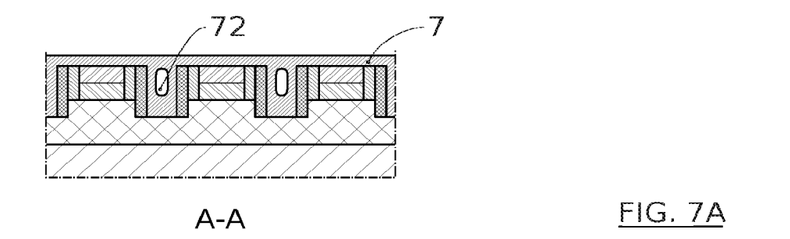
FIG. 7A presents the formation of a constrained layer.
Figure 7B:
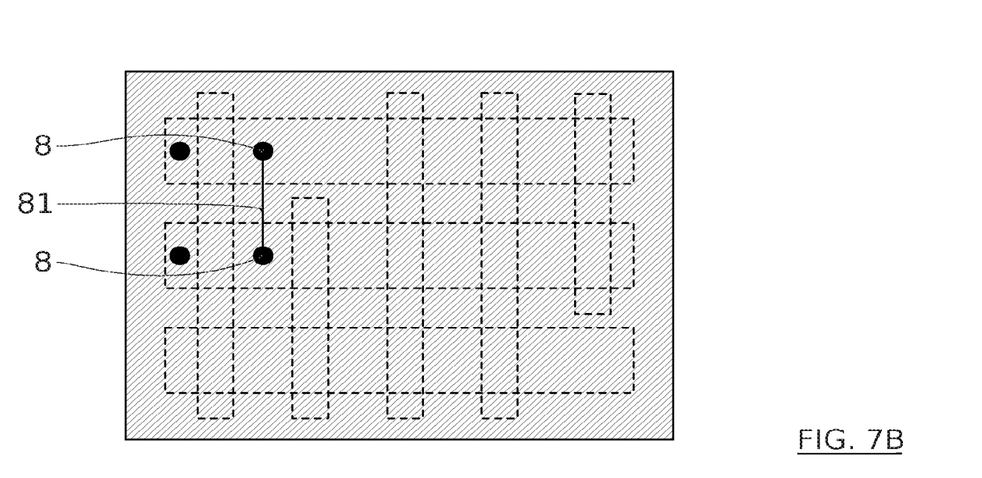
FIG. 7B presents a top view schematising a short-circuit between two electrical contacts.

Finally, a constrained layer 7 can be deposited. Given the undesirable consumption of the electrical isolation zones between two adjacent transistors, the display aspect ratio of the patterns formed in the cavity at this level is increased, which does not reduce the penalise the reliability of the filling of the spaces between two adjacent transistors. FIG. 7A reveals that gaps 72 can subsist even within the material of the constrained layer 7. These residual gaps moreover forbid a complete filling by other layers above the constrained layer 7, and in particular an upper electrical isolation layer, generally made of silicon dioxide, in particular when the transistor stage thus constituted is embedded in the middle of line of a complete microelectronic device. The defects constituted by these residual gaps can have damaging consequences when a gap is opened by electrical contacts subsequently formed and having in particular an alignment problem. In this case, during the deposition of the conductive material (for example, tungsten), in particular by chemical vapour deposition, the defect is fulfilled by the conductive material and would create a short-circuit between two contact zones of two adjacent active zones which are not intended to be electrically connected. FIG. 7B schematically reveals two contact elements 8 present on active zones 11, adjacent and connected by a short-circuit zone 81 undesirably formed through a residual gap connected to a filling defect of the constrained layer and of the oxide layer surmounting the transistors.

Regarding these disadvantages, it is currently necessary to preserve a significant space between two adjacent transistors which involves, either a limitation of density of implanting transistors on the substrate, or a step of etching the protective layer 4 to increase the width of the spaces between the transistors, which constitutes an additional step and which can, on the other hand, affect the other components, in particular the silicified portion, the semi-conductive material of the active zones or also the material of the isolation zones itself.

Consequently, there is a need to improve the techniques of producing current microelectronic components.

SUMMARY

An aspect of the invention relates to a method for producing a microelectronic component on a substrate which comprises at least one active zone and at least one electrical isolation zone adjacent to the active zone, the method comprising a formation of a transistor gate on the active zone, a formation of spacers and a formation of source and drain zones by doping portions of the active zone adjacent to the gate, characterised in that it comprises:

a formation of a first layer, made of a spacer material, above the active zone and above the electrical isolation zone;

an ion implantation configured to produce a doping of the portions of the active zone adjacent to the gate through the first layer;

a removal of a modified portion of the first layer situated overlooking the portions of the active zone adjacent to the gate, said modified portion coming from ion implantation, said removal being configured to preserve the first layer at the level of the edges of the gate. During this phase, the removal of the modified portion of the first layer advantageously relates to all of the active zone and the electrical isolation zone.

Advantageously, during the ion implantation, the first layer forms a protective coating of the electrical isolation zone, and this during any implantation and until the completion thereof, including if the implantation comprises several implantation steps.

A sequence of forming spacers is benefited from, to generate, temporarily, a protective coating of the zones intended to form the sources/drains. This coating is used, during at least one ion implantation phase implemented to dope the portions producing the sources and the drains (implantation phase which generally comprises several subphases, in particular to produce the two doping types, N and P, of CMOS techniques). Advantageously, the coating created thanks to the first layer made of a spacer material remains in place until the complete doping is achieved; in particular, when several implantations are followed (for example, a first weak doping, then a stronger doping), the coating can be conserved until the completion thereof.

Thus, the implantation will not, or only in a limited manner, impact the electrical isolation zone. This avoids damaging it while the current techniques tend to hollow it during the formation of sources/drains, and this hollowing induces, as described above, electrical isolation defects in the electrical isolation zone.

Insofar as the protective coating comes from a layer intended to form spacers, this protection of the isolator is performed without the deposition itself being dedicated. Indeed, advantageously, at least some of the vertical portions of the first layer is conserved, to form the spacers. Consequently, the present invention partially diverts the function of the phase of forming spacers, to itself affect an additional functionality.

The method of the invention is particularly useful in the context, however non-limiting, of subsequent recovery of the isolation zone by at least one other layer, in particular at least one from among a constrained layer and an isolation layer. Indeed, the formation of these layers is performed with a better filling of the spaces between the patterns that form the components and which are located for some on the isolation zone. Residual gaps are avoided which can be damaging, as they can be subsequently filled with electrically conductive materials, in particular during the formation of conductive elements such as electrical failover contacts for the sources, drains and transistor gates.

The invention also relates to an electronic component obtained by the aspects described of the method of the invention.

BRIEF DESCRIPTION OF THE FIGURES

Aims, objectives, as well as the features and advantages of the invention will best emerge from the detailed description of an embodiment of the latter, which is illustrated by the following supporting drawings, wherein.

The drawings are given as examples and are not limiting of the invention. They constitute schematic principle representations intended to facilitate the understanding of the invention and are not necessarily to the scale of practical applications. In particular, the relative thicknesses of the different layers are not representative of reality. In the present patent application, the thickness is taken along a direction perpendicular to the main faces of the substrate, on which the different layers rest. In the figures, the thickness is taken along the vertical.

DETAILED DESCRIPTION

Before starting a detailed review of embodiments of the invention, below, optional features of aspects of the invention are stated, which can possibly be used in association or alternatively:

- a preliminary partial removal of the first layer 100 is performed before the implantation, with an anisotropic etching configured to reduce, without removing it totally, the thickness of the first layer 100 above the portions of the active zone 11 adjacent to the gate 21 or more generally, above the active zone 11 and/or above the electrical isolation zone 12;
- the anisotropic etching is configured to preserve a thickness of the first layer 100 of at least 2 nm, and preferably 3 nm, above the portions of active zone 11 adjacent to the gate 21 or more generally, above the active zone 11 and/or above the electrical isolation zone 12;
- the anisotropic etching is configured to preserve a thickness of the first layer 100 of at most 5 nm above the portions of the active zone 11 adjacent to the gate 21 or more generally above the active zone 11 and/or of the electrical isolation zone 12;
- the ion implantation comprises several implantations, and in particular a first implantation and a second implantation;
- the method successively comprises, after the first ion implantation and before the removal of the modified portion: a formation, on the first layer, of at least one additional layer; a second ion implantation configured to produce a second doping of the portions of the active zone 11 adjacent to the gate 21.
- Possibly, the formation, on the first layer, of at least one additional layer can comprise: a formation, on the first layer, of an intermediate layer made of a second material different from the spacer material; and a formation, on the intermediate layer, of an upper layer made of a third material different from the second material.
- Optionally, after the formation of the upper layer, the following can be proceeded with: a removal, at least partial, of the horizontal portions of the upper layer with a first etching, anisotropic; the second ion implantation; a complete removal of the upper layer, comprising a second etching using the intermediate layer as a stop layer; a complete removal of the intermediate layer, comprising a third etching which is selective relative to the spacer material.
- the method possibly comprises successively, after the ion implantation and before the removal of a modified portion:
- a formation, on the first layer 100, of an intermediate layer 200, made of a second material different from the spacer material;
- a formation, on the intermediate layer 200, of an upper layer 300, made of a third material different from the second material;
- a removal, at least partial, of the horizontal portions of the upper layer 300 with a first etching, anisotropic;
- a second ion implantation configured to produce a second doping of the portions of the active zone 11 adjacent to the gate 1;
- a complete removal of the upper layer 300 comprising a second etching using the intermediate layer 200 as a stop layer;
- a complete removal of the intermediate layer 200, comprising a third etching which is selective relative to the spacer material;
- the removal of the horizontal portions of the upper layer 300 is total, by using the intermediate layer 200 as a stop layer of the first etching;
- the third etching is configured to produce, after the removal of the intermediate layer 200, the removal of a modified portion of the first layer 100, said modified portion coming from the ion implantation;
- the second etching is isotropic;
- the third etching is isotropic;
- the third material is chosen identical to the spacer material;
- the method according to the invention comprises, after the removal of a modified portion, a formation of at least one constrained layer 400 configured to cover, by tensioning it or by compressing it, a portion of the substrate 1 comprising at least one source zone or one drain zone;
- after the formation of the at least one constrained layer 400, the method comprises a formation of an electrically isolating layer 500;
- after the formation of an electrically isolating layer, the method comprises a formation of at least one electrical contact element 8 in electrical connection with a drain zone or underlying source zone;
- a bulk substrate 1 is used, of which at least one active zone 1 is made of a semi-conductive material and of which at least one electrical isolation zone 12 is an electrical isolation trench;
- the method is configured to produce at least one microelectronic component of the MOS type.

It is specified that in the scope of the present invention, the term "on", "surmounts", "covers" or "underlying" or the equivalents thereof do not necessarily mean "in contact with". Thus, for example, the deposition of a first layer on a second layer, does not compulsorily mean that the two layers are directly in contact with one another, but this means that the first layer covers at least partially the second layer by being either directly in contact with it, or by being separate from it by at least one other layer or at least one other element. Generally, a layer can comprise one or more sublayers.

The present invention makes it possible to produce at least one component, but generally, a plurality of microelectronic components on a substrate. By component, device or microelectronic device element, this means any type of element achieved with microelectronic means. These devices comprise, in particular, in addition to the devices with a purely electronic purpose, micromechanical or electromechanical devices (MEMS, NEMS, etc.), as well as optical or optoelectronic devices (MOEMS, etc.).

Some portions of the device can have an electrical function. Some are used for electrical conduction properties and electrode or equivalent, means elements formed of at least one material having a sufficient conductivity, in the application, to achieve the desired function. Other portions, on the contrary, are used for electrical isolation properties and any material having a sufficient resistivity to achieve this isolation is concerned and is, in particular, called dielectric.

Below, one or more embodiments of the invention implementing successive steps of a method for producing microelectronic components based on a substrate are described.

Unless otherwise arranged, the adjective "successive" does not necessarily imply, even if this is generally preferred, that the steps are followed immediately, intermediate steps could separate them. Moreover, the term "step" is understood as the embodiment of a portion of the method, which can comprise several sub-steps.

Figure 8:
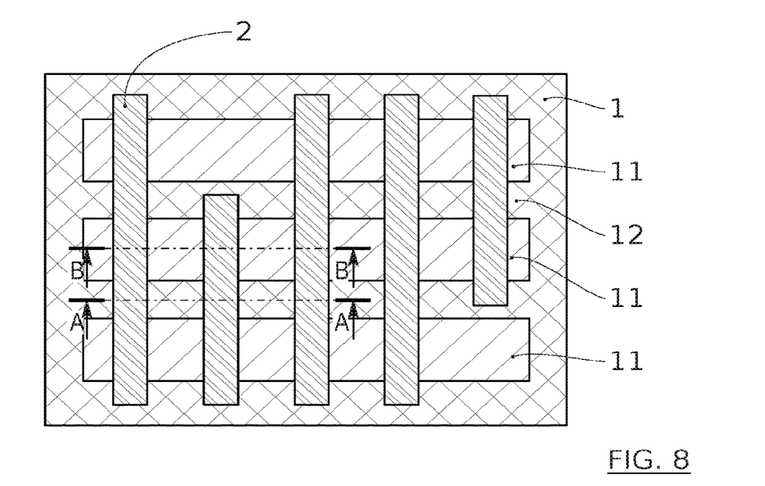
FIG. 8 is a top view, equivalent to that of FIG. 1 and revealing two cross-sectional lines AA and BB used in the following figures to present embodiments of the invention.

The representation of FIG. 8 is similar to that of FIG. 1 in this sense that the method of the invention can be based on a substrate similar to that described above in reference to the state of the art exposed with the support of FIGS. 1 to 7B. Thus, a substrate 1 generally made of a semi-conductive material for the base thereof, and comprising on one of the faces thereof, zones 11 and 12 respectively producing active portions (for constructing, strictly speaking, microelectronic components) and electrical isolation portions is found. As above, the active zones 11 can be made of semi-conductive material, such as silicon, and/or the electrical isolation zones can be made of silicon dioxide and can correspond to the shallow trench isolation technology indicated above.

One of the aspects of the present invention is to enable a good protection of the electrical isolation zones 12 while carrying out the steps of transforming active zones 11 making it possible to produce the microelectronic components. To understand these two aspects well, the figures following FIG. 8 present, at the same time, cross-sectional views along the line A-A of FIG. 8 (at the level of an isolation zone 12) and cross-sectional views along the line B-B of FIG. 8 (at the level of an active zone 11).

Figure 9A:
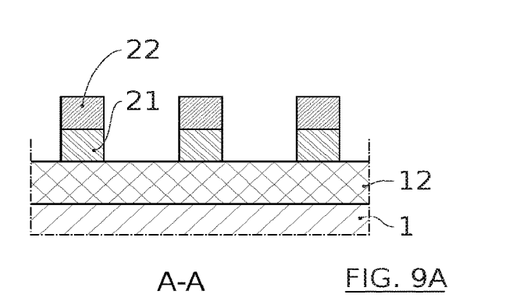
FIG. 9A schematises a phase of producing a microelectronic component, according to the invention and according to the lines A-A of FIG. 8.
Figure 9B:
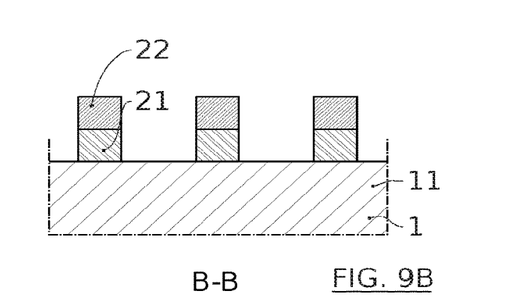
FIG. 9B shows the step of the preceding figure, at the level of the cross-section along the line B-B.

Thus, FIG. 9A conventionally presents a gate 21 overlooking the substrate 1 and coated with a hard mask 22 having been used to produce the gate 21 (the latter is not outlined in detail and can obey conventional lithographic and etching steps). An equivalent view is given in FIG. 9B at the level of the active zone 11. The critical dimension of the gate can be of between 10 nm and 100 nm and is preferably less than or equal to 50 nm. The path between two successive gates is preferably less than or equal to 120 nm. Moreover, the gate 21 height is advantageously less than or equal to 100 nm, and preferably 50 nm. The height of the mask 22 can in particular be of between 40 and 80 nanometres. It can be a nitride mask, in particular silicon nitride.

Figure 10A:
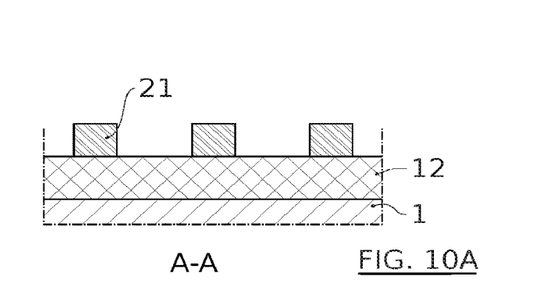
FIG. 10A presents the removal of a mask.
Figure 10B:
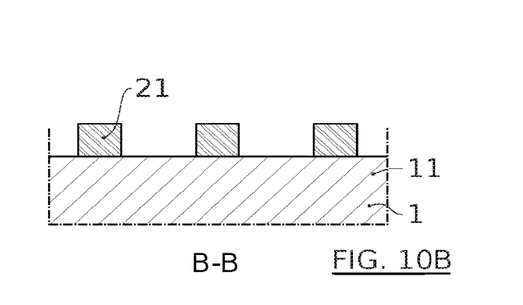
FIG. 10B shows the step of the preceding figure, at the level of the cross-section along the line B-B.

A following step can consist of the removal of the hard mask 22, for example by an isotropic etching (typically a wet etching, for example using a phosphoric acid solution, $H_3PO_4$). The result immediately emerges from FIGS. 10A and 10B.

The formation of a transistor involves, in a manner known per se, the creation of spacers 23 covering all or some of the edges of the gates 21. By "edges", this means lateral zones of the gates 21, i.e. having a vertical component. In the sense of the description, the term "vertical" is understood as a direction oriented along the thickness of the substrate, this direction not being interpreted in the strict sense, a vertical portion could have a minority horizontal component. Conversely, the term "horizontal" is understood as a direction along the plane of the substrate. In the representation of FIG. 8, the edges thereof extend along a direction perpendicular to the cross-sectional lines A-A and B-B. A deposition of a spacer material is carried out above the substrate comprising the gates 21 to form a first layer 100.

Figure 11A:
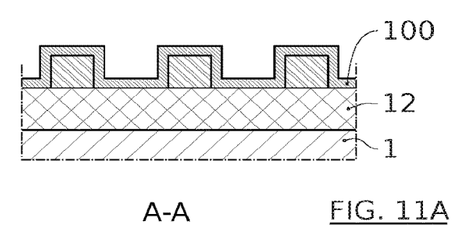
FIG. 11A illustrates the deposition of a first layer.
Figure 11B:
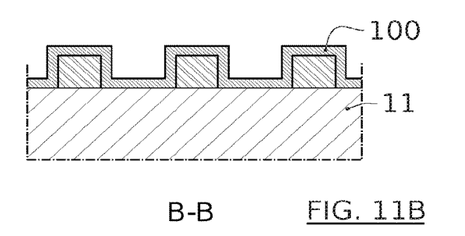
FIG. 11B shows the step of the preceding figure, at the level of the cross-section along the line B-B.

Preferably, this is a conformal deposition. It is, furthermore, preferably carried out as "solid plate", which is also the preferred case for the deposition of the layers 200 and 300 discussed below. According to an example, the conformal deposition is achieved by one of the following depositions: plasma-enhanced chemical vapour deposition (PECVD), low-pressure chemical vapour deposition (LPCVD), rapid thermal chemical vapour deposition (RT-CVD), physical vapour deposition (PVD). Silicon nitride can be used as a spacer material, or also a Low-k type material (of dielectric constant k<7; it can be SiBCN or SiCO). Generally, a thickness of this deposition of less than 15 nm is sufficient. The thickness can be of between 6 nm and 15 nm, preferably between 8 nm and 12 nm, and more preferably between 9 and 10 nm. The result which can be seen in FIGS. 11A and 11B is obtained.

Figure 12A:
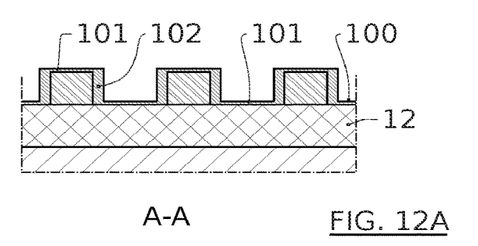
FIG. 12A reveals the result of an anisotropic etching.
Figure 12B:
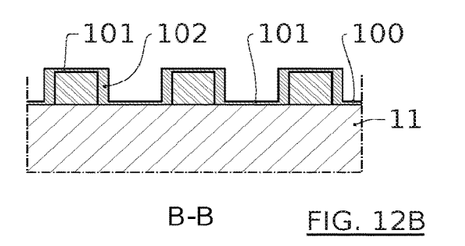
FIG. 12B shows the step of the preceding figure, at the level of the cross-section along the line B-B.

FIGS. 12A and 12B present an optional, but advantageous step of the invention according to which a partial and anisotropic etching of the layer 100 formed beforehand is performed, to taper the horizontal portions 101 of the layer 100, while preserving, or by tapering less, the vertical portions 102 corresponding to those intended to cover the gate 21 edges. In particular, a step of the invention in this preferred embodiment consists of tapering the layer 100 at the level of a horizontal portion 101 of these situated between two gates 21. The tapering of the horizontal portion 101 above the gates 21 is not necessary, and, in the embodiment indicated here for the tapering, constitutes a secondary effect. Generally, it will preferably be a partial, anisotropic plasma etching. This tapering can be performed in an inductive coupling reactor. Preferably, the tapering is configured such that the thickness of the horizontal portion 101 between the gates 21 remains at least equal to a dimensional threshold which can be at least 3 nm. It is, however, desirable that the residual thickness is not too high, for example, less than 6 nm. A target threshold fixed at 5 nm, can, in this range, be satisfactory. Alternatively or complementarily, the threshold can be fixed according to the thickness of the conformal deposition of the spacer material, for example by producing a tapering of at least 30%, preferably 50%, of this thickness. Alternatively or complementarily, the tapering can be greater than or equal to 70% of the initial thickness.

It is understood that the spacer material is preserved on the horizontal portions 101 and not totally removed in these places. Indeed, an aspect of the invention is to use the horizontal portions 101, situated between the gates 21, as a protective coating of the underlying materials, and in particular, of the material of the electrical isolation zone 12. It will be seen, in the following steps, that this makes it possible to ensure the integrity of the electrical isolation zone 12 in some production steps, in particular connected to the ion implantation. This integrity extends from the maintaining in place of the material of the isolation zones, even if it can undergo transformations connected to the ion implantation.

Figure 13A:
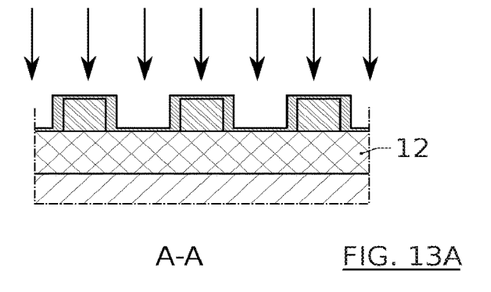
FIG. 13A presents an implantation phase.
Figure 13B:
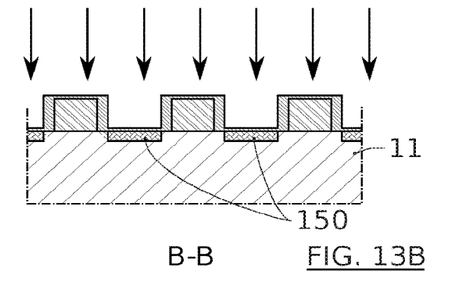
FIG. 13B shows the step of the preceding figure, at the level of the cross-section along the line B-B.
Figure 16A:
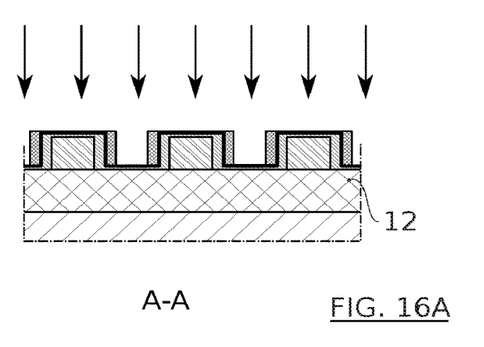
FIG. 16A presents a second implantation.

The ion implantation introduced in the preceding paragraph is presented, in a first phase, in FIGS. 13A and 13B. It will be seen that the method of the invention can comprise several ion implantation phases, and in particular a first phase corresponding that of FIGS. 13A and 13B and a second phase illustrated below, in FIGS. 16A and 16B. This embodiment is however not limiting, and the invention can be implemented with other ion implantation phases or one single phase. In this context, the ion implantation can, for example, comprise a first implantation corresponding to the ion implantation phase described below, and a second subsequent ion implantation, and in particular carried out after formation of at least one additional layer on the first layer 100. Moreover, an ion implantation phase preferably comprises subphases so as to produce different types of doping (P and N), to reach a production of CMOS type and comprising NMOS components and PMOS components. To this end, the invention can use conventional techniques to perform doping, strictly speaking, and the definition of the zones to be doped.

According to an example, the parameters of the implantation, in particular the energy of the ions, are chosen so as to modify by implantation, some of the thickness of the active zone 11 situated between two gates 21 to produce the implantation zones 150, despite the fact that the implantation must pass through the horizontal portion 101 of the layer 100 surmounting the implantation zone 150. In an embodiment, the implantation phase corresponding to FIGS. 13A and 13B is of the lightly doped type, and can correspond to the contents of doping species provided in the "Lightly Doped Drain-Source (LDD)" type doping. A simulation step can make it possible to adjust the dose and the energy.

With this implantation being done, other steps are advantageously proceeded with, before removing the horizontal portions 101 of the layer 100 surmounting the source/drain zones. It is, in particular, advantageous to prepare a second implantation, which can be performed with doping doses higher than the first, in particular in the context of an implantation of the "Highly Doped Drain-Source (HDD)" type. In particular, an embodiment option of the present invention comprises the formation of at least one additional layer on the first layer 100, this formation being performed after the ion implantation indicated above. Then, the second implantation is proceeded with, of which the sector is found defined by the contour of the at least one additional layer, possibly after the additional steps of shaping the at least one additional layer, in particular of the partial etching steps.

It will be noted that in this case, the second implantation occurs after the phase of depositing at least one additional layer, while the initial ion implantation has occurred before the phase of depositing at least one additional layer.

Figure 14A:
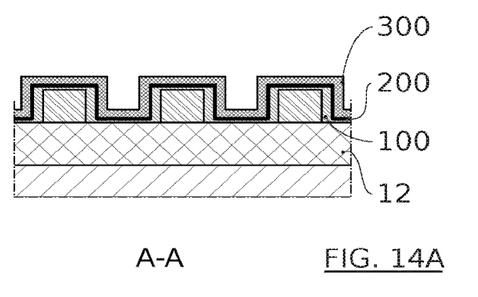
FIG. 14A corresponds to the deposition of an intermediate layer and of an upper layer.
Figure 14B:
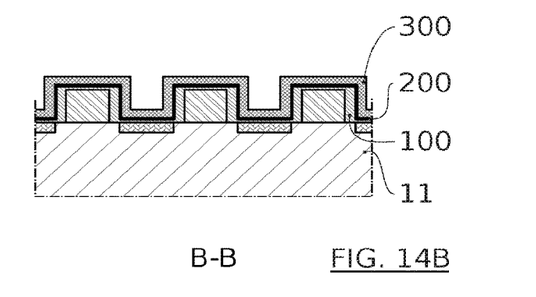
FIG. 14B shows the step of the preceding figure, at the level of the cross-section along the line B-B.

It is in this context, FIGS. 14A and 14B present a subsequent step comprising the deposition of an intermediate layer 200 and the deposition of an upper layer 300. These two layers are made of different materials so as to produce a selectivity during an etching which will be described below. For example, the intermediate layer 200 can be made of an oxide of semi-conductive material, and in particular, silicon dioxide. As an example, the thickness thereof can be greater than 3 nm and/or less than 10 nm. A thickness of 7 nm is preferred. Regarding the upper layer 300, it can be a nitride of semi-conductive material, and in particular, silicon nitride. As an example, the thickness thereof can be greater than 20 nm and/or less than 40 nm. A thickness of 30 nm is preferred. Advantageously, at least one of these depositions, but preferably both, is carried out in a conformal manner, in particular with the deposition technologies discussed above for the formation of the layer 100.

Figure 15A:
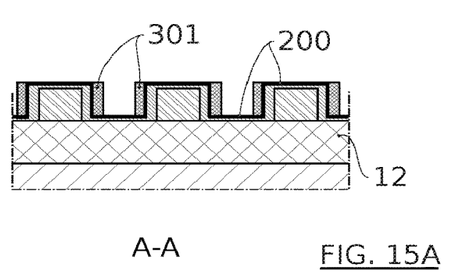
FIG. 15A shows a partial removal of the upper layer.
Figure 15B:
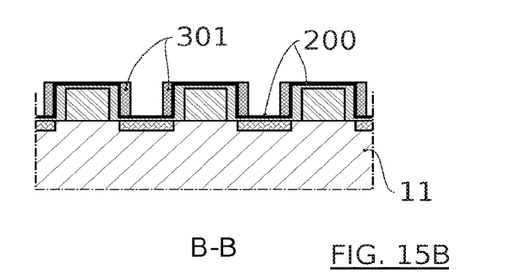
FIG. 15B shows the step of the preceding figure, at the level of the cross-section along the line B-B.

The vertical portions 301 of the layer 300 will make it possible to increase the width of material covering the edges of the gates 21 and, consequently, to reduce the interstitial space between two adjacent microelectronic components, to laterally delimit a second ion implantation. Before this implantation, it is however desirable to remove at least partially, but preferably totally, the horizontal portions of the upper layer 300, at least at the level of the source/drain zones which will form the subject of the second implantation. To this end, an anisotropic etching can be performed, in particular in an ICP reactor, for example of fluorocarbon type, for the etching of silicon nitride. This step is represented in FIGS. 15A and 15B. The intermediate layer 200 is used as a limiting layer of this anisotropic etching and a material, sufficiently selective with respect to the chemistry of the anisotropic etching will advantageously be used for this layer. Despite all this, a partial consumption of the material of the layer 200 can be tolerated. In the horizontal portions of this layer, the etching will be configured such that it remains preferably at least 2 nm and/or less than 5 nm of thickness of the material of the layer 200. Alternatively or cumulatively, the residual thickness of the layer 200 can be defined in the horizontal portions thereof at least 20% of the initial thickness thereof. In any case, the material of the upper layer 300 is totally removed in the horizontal portions covering the portions of the active zone intended to form the sources/drains.

Figure 16B:
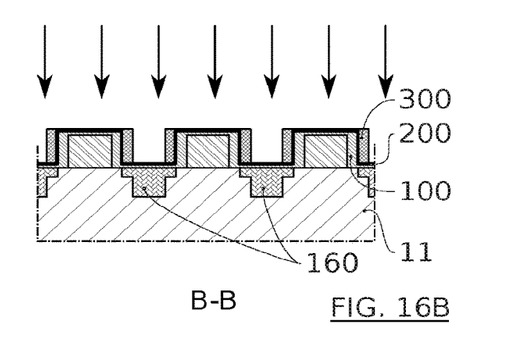
FIG. 16B shows the step of the preceding figure, at the level of the cross-section along the line B-B.

In this situation, a second implantation is thus performed (preferably of HDD type to define the strictly speaking Source/Drain accesses of the transistors), so as to finalise the production of the source/drain zones 160 as FIG. 16B shows. A simulation step can make it possible to adjust the dose and the energy.

The following step is a removal of the residual portions of the upper layer 300. This can be done by an isotropic etching, in particular a wet etching, for example with a phosphoric acid solution in the case of a silicon nitride layer 300. This etching is preferably stopped on the intermediate layer 200, of which the material is preferably selective relative to said etching. The layer 200 can then, itself be removed, still for example by way of an isotropic etching, in particular of wet type, for example with a hydrofluoric acid solution if the intermediate layer is made of silicon dioxide.

In this manner, the materials of the layers 200 and 300 are totally removed at the surface of the substrate. Furthermore, the implantation phase(s) has/have inherently led to a modification of the material of the first layer 100, in the zones situated overlooking the implanted zones, at the level of the portions of the active zone 11 leading to the production of the sources/drains. Due to this, the material is found to be weakened in these places, as a result of the etching being made possible for the removal of the intermediate layer 200 produced, if it is continued, results in a removal of the portions 101. Preferably, a lightly concentrated etching solution is used for the latter etching, and with a limited time, so as to remove the portions 101 without however consuming or consuming too much material underlying these portions. In the case of the example of a hydrofluoric acid solution, a concentration of 1% at most satisfies, to this end. While the etching in question is preferably selective so as to not etch the spacer material, the implantation is, advantageously, configured to transform the spacer material so as to make it more sensitive to this etching. The vertical portions 102 are therefore not or are slightly affected by the etching, preserving the spacers 23.

Figure 17A:
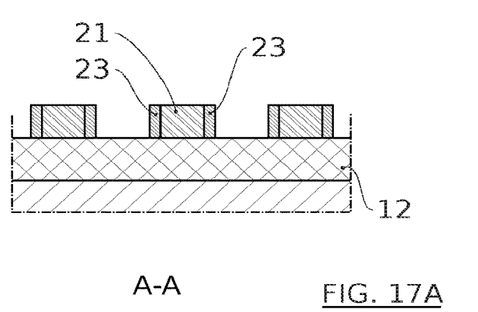
FIG. 17A is the result of a removal of some of the layers.
Figure 17B:
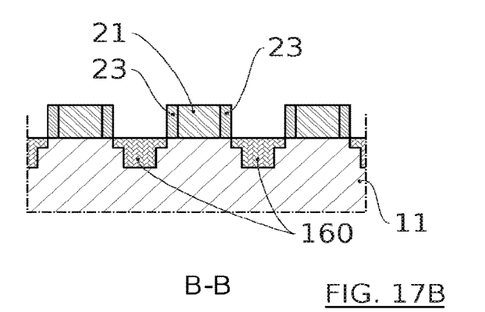
FIG. 17B shows the step of the preceding figure, at the level of the cross-section along the line B-B.

The result of these removal phases is revealed by FIGS. 17A and 17B.

Figure 18A:
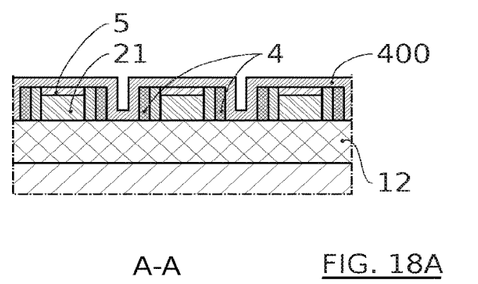
FIG. 18A presents a subsequent step with formation of a protection on the spacers and of a constrained layer.
Figure 18B:
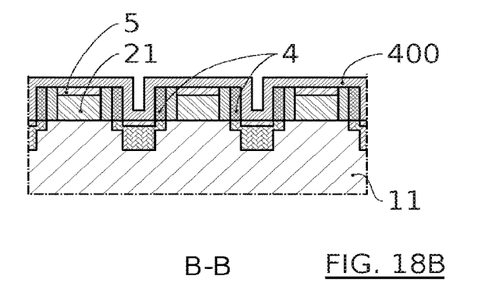
FIG. 18B shows the step of the preceding figure, at the level of the cross-section along the line B-B.

FIGS. 18A and 18B present a configuration after the carrying out of additional steps which are advantageously, but not in a limiting manner, all carried out. One of them is the formation of a protective layer 4 on the spacers 23 (it is not detailed and can be conventionally carried out, with a solid plate deposition of a material such as silicon nitride, followed by a lithography then an etching and a removal of the lithographic mask to only preserve the protective layer 4 in useful places, namely by covering the lateral surface of the spacers 23). Another additional step is the formation of a portion 5 by superficial silicifying of the material being used to produce the gate 21 and source/drain zones 160.

On the other hand, these figures show the deposition of a constrained layer 400. Typically, the constrained layer 400 is a nitride layer. It is, for example, a silicon nitride layer ($Si_xN_y$ x and y being whole numbers). Preferably, the constrained layer 400 is made of SiN. The formation of the constrained layer comprises a conform deposition. It is, for example, carried out by one of the following deposition techniques: plasma-enhanced chemical vapour deposition (PECVD), low-pressure chemical vapour deposition (LPCVD), rapid thermal chemical vapour deposition (RT-CVD), physical vapour deposition (PVD), atomic layer deposition (ALD). Other types of depositions can be considered. It can have a thickness from a few nanometres to a few tens of nanometres, and in particular a thickness of between 5 and 40 nanometres, for example, 20 nm. It is not excluded from depositing a plurality of constrained layers 400 or from limiting the coating of the constrained layer 400 to a portion of the face of the substrate, and, possibly, from coating at least one other portion of the face of the substrate by at least one other constrained layer, for example to implement constraints of different directions (compressed and tensioned).

Figure 19A:
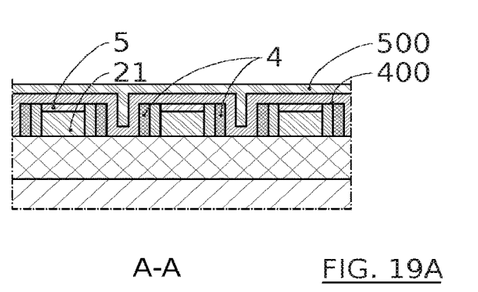
FIG. 19A reflects the effectiveness of filling spaces between the transistors by an electrically isolating layer.
Figure 19B:
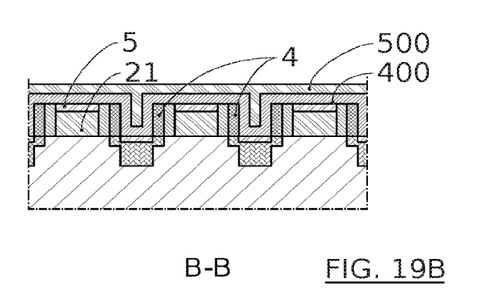
FIG. 19B shows the step of the preceding figure, at the level of the cross-section along the line B-B.

An interest of the invention is to increase the reliability of producing components, which is particularly useful in the case where an electrical isolating layer 500 is then returned on the face of the substrate 1, for example a silicon dioxide layer, in particular for an incorporation of the level of electrical components thus produced in a more complex microelectronic device, comprising for example a plurality of stages, of which the level thus produced can constitute an intermediate portion, in particular a Middle of Line portion. The deposition techniques mentioned above can be used for the layers 100 to 400 to perform this filling by the layer 500. FIGS. 19A and 19B show such a filling with a good succession of layers, without any gaps. Indeed, the protection offered during the preceding phases by the portions 101 of the first layer 100, then by the horizontal portions of the layers 200 and 300, have made it possible to protect the underlying materials, and in particular the material of the electrically isolating zones 12, during production steps during which these protections were present. With them not being hollowed, the isolating material portions of the zones 12 do not undergo an undesirable increase of the display aspect ratio thereof, which, until now, impeded the subsequent fillings at this level.

Electrical contacts passing through the electrically isolating layer 500 and joining one of the functional portions of the MOS component (such as source/drain zones) can thus be formed, without any risk of unintentional filling of a residual gap in the stack of preceding layers. In particular, such contacts can be metal, for example made of tungsten, and the absence of any gap forbids the diffusion of material of the contacts within the electrical isolation zones 12, between two active zones 11.

The invention claimed is:

1. A method for producing at least one microelectronic component on a substrate, which comprises, in an exposed manner on a first face of the substrate, at least one active zone and at least one electrical isolation zone adjacent to the at least one active zone, the at least one active zone extending in a lateral direction along the substrate, the method comprising:
    forming a transistor gate on the at least one active zone and extending across at least a portion of the at least one electrical isolation zone in a direction transverse to the lateral direction;
    forming spacers, each configured to cover a surface of a different edge of the transistor gate;
    forming source and drain zones by doping portions of the at least one active zone adjacent to the transistor gate;
    the method further comprising successively:
        forming a first layer, made of a spacer material, above the at least one active zone and above the at least one electrical isolation zone;
        performing an ion implantation configured to produce a further doping of the portions of the at least one active zone adjacent to the transistor gate through the first layer to finalize the forming of the source and drain zones, the first layer forming a protective coating of the at least one electrical isolation zone during all of the ion implantation and until completion thereof; and
        removing a modified portion of the first layer disposed overlooking the at least one active zone and the at least one electrical isolation zone, the modified portion coming from the ion implantation, the removing being configured to at least partially preserve the first layer at a level of edges of the transistor gate.

2. The method according to claim 1, further comprising a preliminary partial removal of the first layer before the ion implantation, with an anisotropic etching configured to reduce, without totally removing, a thickness of the first layer above the at least one active zone and above the at least one electrical isolation zone.

3. The method according to claim 2, wherein the anisotropic etching is further configured to preserve a thickness of the first layer of at least 2 nm above the at least one active zone and above the at least one electrical isolation zone.

4. The method according to claim 2, wherein the anisotropic etching is further configured to preserve a thickness of the first layer of at least 3 nm above the at least one active zone and above the at least one electrical isolation zone.

5. The method according to claim 2, wherein the anisotropic etching is further configured to preserve a thickness of the first layer of at most 5 nm above the at least one active zone and above the at least one electrical isolation zone.

6. The method according to claim 1, wherein the ion implantation comprises a first ion implantation and, successively, after the first ion implantation and before the removal of the modified portion:
    forming at least one additional layer on the first layer; and
    a second ion implantation configured to produce a second doping of the portions of the at least one active zone adjacent to the transistor gate.

7. The method according to claim 6, wherein the forming of the at least one additional layer comprises:
    forming an intermediate layer on the first layer, made of a second material different from the spacer material; and
    forming an upper layer on the intermediate layer, made of a third material different from the second material.

8. The method according to claim 7, further comprising, after forming the upper layer:
    at least partially removing horizontal portions of the upper layer with a first anisotropic etching;
    performing the second ion implantation;
    completely removing the upper layer, comprising a second etching using the intermediate layer as a stop layer; and
    completely removing the intermediate layer, comprising a third etching, which is selective relative to the spacer material.

9. The method according to claim 8, wherein the removing of the horizontal portions of the upper layer is total, by using the intermediate layer as a stop layer of the first etching.

10. The method according to claim 8, wherein the third etching is configured to produce, after the removing of the intermediate layer, the removing of the modified portion of the first layer, the modified portion coming from the ion implantation.

11. The method according to claim 8, wherein the second etching is isotropic.

12. The method according to claim 8, wherein the third etching is isotropic.

13. The method according to claim 7, wherein the third material is identical to the spacer material.

14. The method according to claim 1, further comprising, after the removing of the modified portion, forming at least one constrained layer configured to cover, by tensioning or by compressing the at least one constrained layer, a portion of the substrate comprising at least one source zone or one drain zone.

15. The method according to claim 14, further comprising, after the forming of the at least one constrained layer, forming an electrically isolating layer.

16. The method according to claim 15, further comprising, after the forming of the electrically isolating layer, forming at least one electrical contact element in electrical connection with a drain zone or underlying source zone.

17. The method according to claim 1, wherein a bulk substrate is used, of which at least one active zone is made of a semi-conductive material and of which at least one electrical isolation zone is an electrical isolation trench.

18. The method according to claim 1, being further configured to produce at least one microelectronic component of MOS type.

* * * * *